(12) United States Patent
Miller et al.

(10) Patent No.: US 10,567,654 B2
(45) Date of Patent: Feb. 18, 2020

(54) AUTOMATIC STRUCTURALLY INDUCED LINE OF SIGHT JITTER COMPENSATION FOR ELECTRO-OPTICAL/INFRARED TURRET SYSTEM

(71) Applicant: Raytheon Company, Waltham, MA (US)

(72) Inventors: Kirk A. Miller, Dallas, TX (US); Christopher J. Baker, McKinney, TX (US); Steven A. Miller, McKinney, TX (US); Walter W. Norman, Fairview, TX (US); Lyale F. Marr, Richardson, TX (US); Richard L. Scott, Allen, TX (US)

(73) Assignee: RAYTHEON COMPANY, Waltham, MA (US)

( * ) Notice: Subject to any disclaimer, the term of this patent is extended or adjusted under 35 U.S.C. 154(b) by 453 days.

(21) Appl. No.: 15/499,120

(22) Filed: Apr. 27, 2017

(65) Prior Publication Data
US 2018/0316862 A1    Nov. 1, 2018

(51) Int. Cl.
*H04N 5/232* (2006.01)
*B60Q 1/00* (2006.01)
(Continued)

(52) U.S. Cl.
CPC ....... *H04N 5/23264* (2013.01); *B60Q 1/0041* (2013.01); *G01B 11/272* (2013.01);
(Continued)

(58) Field of Classification Search
CPC .............. H04N 5/23264; B60Q 1/0041; G01B 11/272; G01P 13/00; G02B 27/646; H01L 27/14629
See application file for complete search history.

(56) References Cited

U.S. PATENT DOCUMENTS 4,123,136 A * 10/1978 Dahab .................. G01C 21/165
                                                        250/203.6
6,653,611 B2    11/2003 Eckelkamp-Baker et al.
(Continued)

OTHER PUBLICATIONS

Kim, J.J., "Optical Beam Jitter Control for HEL Beam Control Testbed," Nov. 14-18, 2011, 14th Annual Directed Energy Symposium, San Diego 11-Symp-080, http://hdl.handle.net/10945/34526.
(Continued)

*Primary Examiner* — Mary Ellen Bowman
(74) *Attorney, Agent, or Firm* — Renner, Otto, Boisselle & Sklar, LLP

(57) ABSTRACT

A light sensor system including a reference light source that moves in unison with a primary mirror and/or an inertial measurement device, and/or the reference light source is directed toward an obscured region of the light sensor system. The reference light source may allow for improved jitter compensation based on feedback of the reference light. The feedback may be representative of the elastic deformation of the optics and telescope optical axis. The improved jitter compensation may allow for the light sensor system (e.g., the housing and/or mirrors) to be built with less stiff materials, which can reduce the cost of manufacturing the present light sensor system compared to previously known optical sensor systems. In cases of high vibration levels which would otherwise degrade the resulting image quality after material stiffness property selections have been exhausted, the light sensor system may provide jitter compensation to improve video or still image quality.

20 Claims, 11 Drawing Sheets

(51) Int. Cl.
    *G01P 13/00*     (2006.01)
    *H01L 27/146*     (2006.01)
    *G01B 11/27*     (2006.01)
    *G02B 27/64*     (2006.01)

(52) U.S. Cl.
    CPC ............ *G01P 13/00* (2013.01); *G02B 27/646* (2013.01); *H01L 27/14629* (2013.01)

(56) References Cited

U.S. PATENT DOCUMENTS

| | | |
|---|---|---|
| 8,536,503 B2 | 9/2013 | Cook et al. |
| 2002/0145102 A1* | 10/2002 | Eckelkamp-Baker ............... G01C 15/002 250/203.1 |
| 2016/0320630 A1* | 11/2016 | Donaldson ........... G02B 27/644 |

OTHER PUBLICATIONS

International Search Report and Written Opinion for corresponding International Application No. PCT/US2017/067506 dated Apr. 18, 2018.

* cited by examiner

US 10,567,654 B2

AUTOMATIC STRUCTURALLY INDUCED LINE OF SIGHT JITTER COMPENSATION FOR ELECTRO-OPTICAL/INFRARED TURRET SYSTEM

GOVERNMENT LICENSE RIGHTS

This invention was made with Government support. The Government has certain rights in the invention.

FIELD OF INVENTION

The present invention relates generally to jitter compensation, and more particularly to jitter compensation for electro-optical/infrared turret systems for aircraft.

BACKGROUND

Some aircraft have a gimbaled optical sensor system. The optical sensor system may be used to detect target objects that are located great distances from the aircraft. For example, the optical sensor systems detect target objects that are below the aircraft while the aircraft is in flight.

The optical sensor systems often include an optical sensor and a telescope optical assembly to magnify the light received by the optical sensor to allow the optical sensor to capture images of the target object at great distances. However, during flight of the aircraft the telescope optical assembly and the optical sensor are subjected to random vibration causing optical elements to move relative to one another, resulting in image jitter, which can reduce image quality of full motion video or still images.

Typically, very stiff materials (such as beryllium or silicon carbide) are utilized to build the telescope optical assemblies to increase image quality by limiting optics and telescope deformation which assists in mitigating the jitter. These materials tend to be expensive, which adds to the overall cost of the optical sensor system. Additionally under large enough vibration input levels material stiffness alone will not provide the required optical system stability and image quality will be impacted regardless of cost and complexity in telescope design.

SUMMARY OF INVENTION

The present invention provides a light sensor system including a reference light source that moves in unison with a primary mirror and/or an inertial measurement device, and/or the reference light source is directed toward an obscured region of the light sensor system. The reference light source may allow for improved jitter compensation based on feedback of the reference light. The feedback may be representative of the elastic deformation of the optics and telescope optical axis. The improved jitter compensation may allow for the light sensor system (e.g., the housing and/or mirrors) to be built with less stiff materials, which can reduce the cost of manufacturing the present light sensor system compared to previously known optical sensor systems. In cases of high vibration levels which would otherwise degrade the resulting image quality after material stiffness property selections have been exhausted, the light sensor system may provide jitter compensation to improve video or still image quality.

Directing the reference light source toward the obscured region allows the light sensor system to avoid or reduce any negative impact the reference light source or its associated components may have on the quality of the primary light detected. For example, the reference light source and/or a retroreflector may be arranged in the obscured region so that a minimal additional portion of the primary light, if any, is blocked from reaching the primary light sensor, compared to previously known optical sensor systems.

The light sensor system may include a primary mirror that directs the reference light from the primary mirror along a path of the primary light through the light sensor system to the reference light sensor. The reference light sensor may be able to detect structural movement of the primary mirror and/or other light reflectors that reflect the primary light and the reference light. At least part of the light sensor system may be adjusted based on the reference light directed to the reference light sensor. The adjustment allows correction of components of the light sensor system to compensate for jitter and increase the quality of the primary light received by the primary light sensor.

The adjustable light component (e.g., an adjustable light reflector, such as a fast steering mirror, or an adjustable light refractor, such as a Risley prism assembly) that receives the primary light may be adjusted based on the feedback of the reference light. For example, the adjustable light reflector may be adjusted based on the position and/or movement of the reference light to account for jitter in the light system.

The inertial sensor and the reference light source may be fixed relative to one another to accurately determine the non-inertial motion of the reference light source caused by relative deflections between optical components and the primary mirror. For example, the inertial sensor and/or the reference light source may be fixed in the obscured region to the same inertial sensor mount.

The term "light" is used herein to refer to visible light and invisible light. For example, the term light may be used herein to refer to radio waves, infrared waves, ultraviolet waves, electromagnetic waves having wavelengths anywhere from 400 nanometers (nm) to 700 nm, and/or X-rays.

The term "jitter" is used herein to refer to undesirable motion of the optical axis of the imaging system that occurs during a single frame integration time, which results in blurring the image.

According to one aspect of the invention, a light sensor system includes a housing, a primary mirror with a reflective side facing in a first direction to receive a primary light along a central axis of the primary mirror from a target object, wherein the primary mirror is disposed within the housing, a plurality of light reflectors, at least one of the plurality of light reflectors receiving the primary light directly from the primary mirror, wherein each of the plurality of light reflectors is arranged in a path of the primary light such that each of the plurality of light reflectors receives and reflects the primary light, an inertial sensor mount that is fixed to the primary mirror, a reference light source having an output directed along the first direction, the reference light source attached to the inertial sensor mount and movable with the inertial sensor mount such that, when the inertial sensor mount moves, the output of the reference light source moves with the inertial sensor mount.

According to another aspect of the invention, a light sensor system includes a housing, a primary mirror with a reflective side facing in a first direction to receive a primary light along a central axis of the primary mirror from a target object, wherein the primary mirror is disposed within the housing, a plurality of light reflectors, at least one of the plurality of light reflectors receives the primary light directly from the primary mirror, and wherein each of the plurality of light reflectors is arranged in a path of the primary light such that each of the plurality of light reflectors receives and reflects the primary light, one or more light obstructions between the primary mirror and the target object, wherein the one or more light obstructions form an obscured region where the primary light from the target object would not pass through to reach the reflective side of the primary mirror, and a reference light source that is movable with the primary mirror, wherein an output of the reference light source is directed toward a portion of the obscured region such that when the output provides the reference light the reference light would pass through the portion of the obscured region.

The features of the different aspects may be independently combined with one another or utilized separately. Thus, a light sensor system according to the present invention may include all of, any one of, or any combination of the reference light source that moves with the primary mirror, and the output of the reference light source that is directed toward the portion of the obscured region.

The foregoing and other features of the invention are hereinafter described in greater detail with reference to the accompanying drawings.

DETAILED DESCRIPTION

The principles of this present application have particular application to reducing the effects of jitter for aircraft light sensor systems, for example electro-optical/infrared turret systems that have a Three Mirror Anastigmat (TMA) form telescope to magnify the image of a target object, and thus will be described below chiefly in this context. It will be appreciated that principles of this invention may be applicable to other light sensor systems where it is desirable to reduce the effects of jitter, such as other telescope forms.

Figure 1:
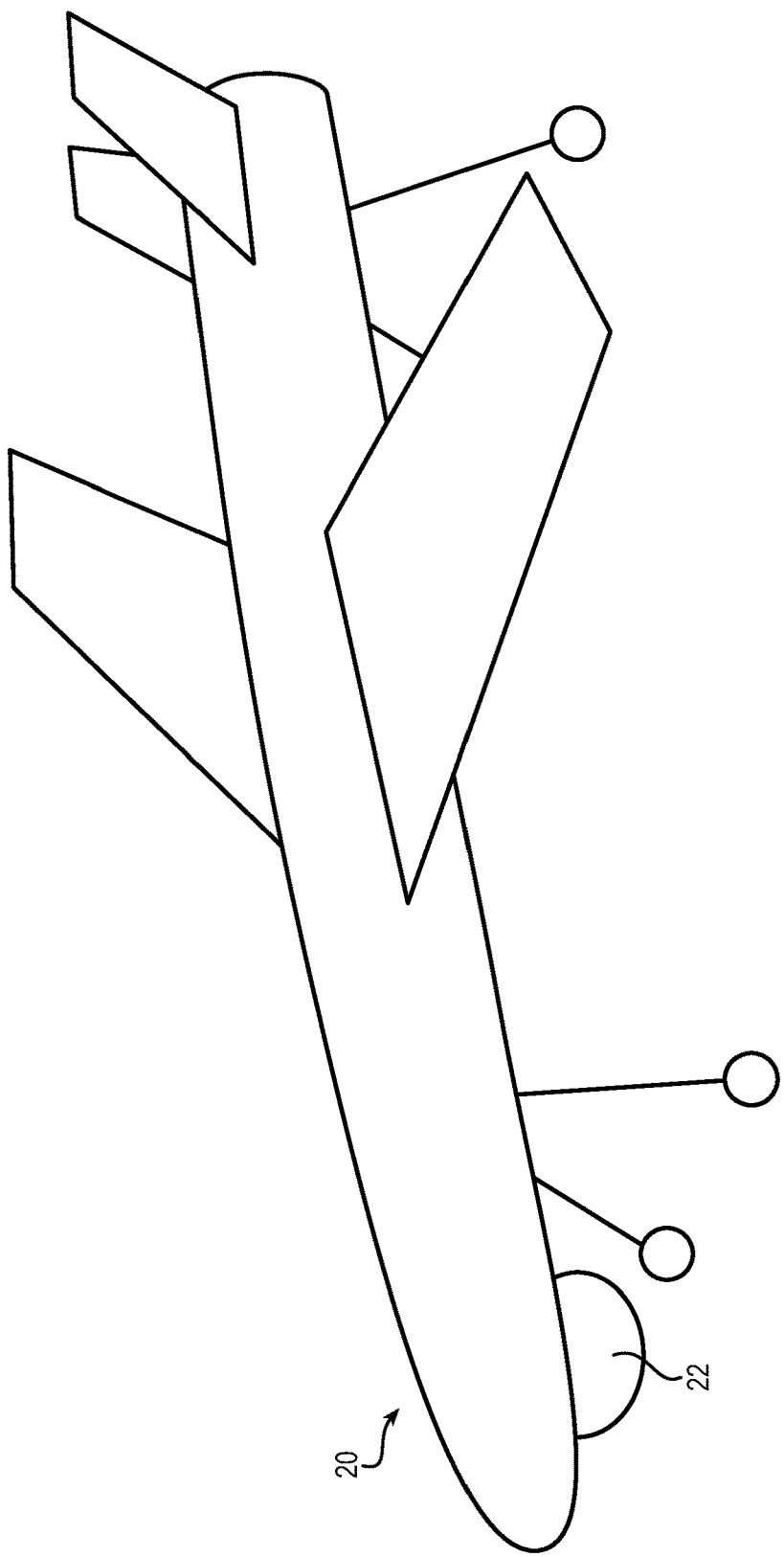
FIG. 1 is an oblique view of an exemplary aircraft including an exemplary light sensor system.

Referring now to the drawings and initially to FIG. 1, an exemplary aircraft is designated generally by reference numeral 20. The aircraft 20 can be provided with an exemplary light sensor system 22. The light sensor system 22 may capture images of primary light received from a target object, such as an infrared heat signature of a vehicle thousands of feet below the aircraft 20. In an embodiment, the aircraft is another type of vehicle, such as a ground operated vehicle.

The light sensor system 22 may include any or all of the components of the sensor system disclosed in U.S. Pat. No. 9,170,106 entitled SHOCK-RESISTANT DEVICE AND METHOD issued on Oct. 27, 2015, the entirety of which is hereby incorporated by reference.

Figure 2:
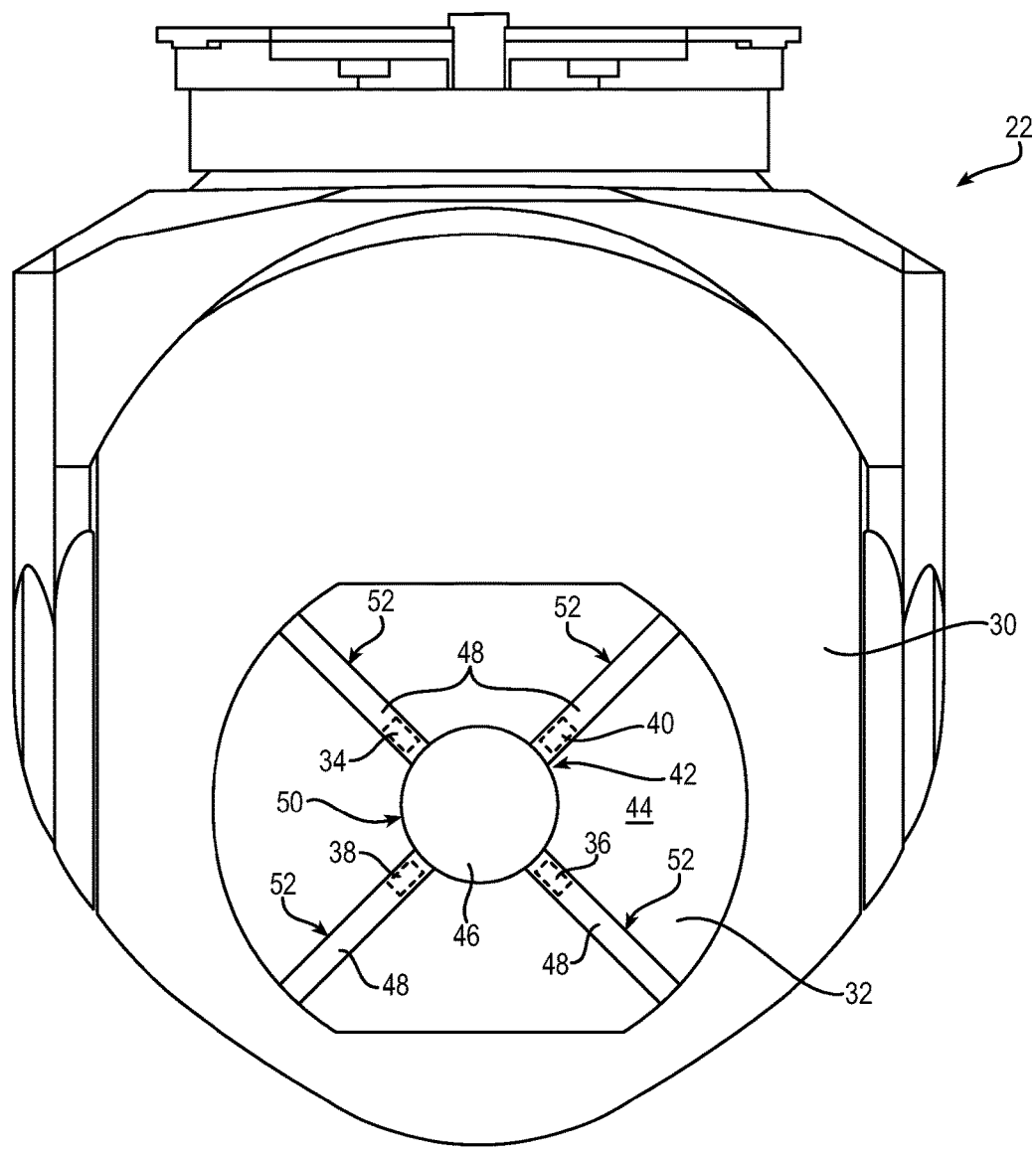
FIG. 2 is a front view of the light sensor system of FIG. 1.
Figure 3:
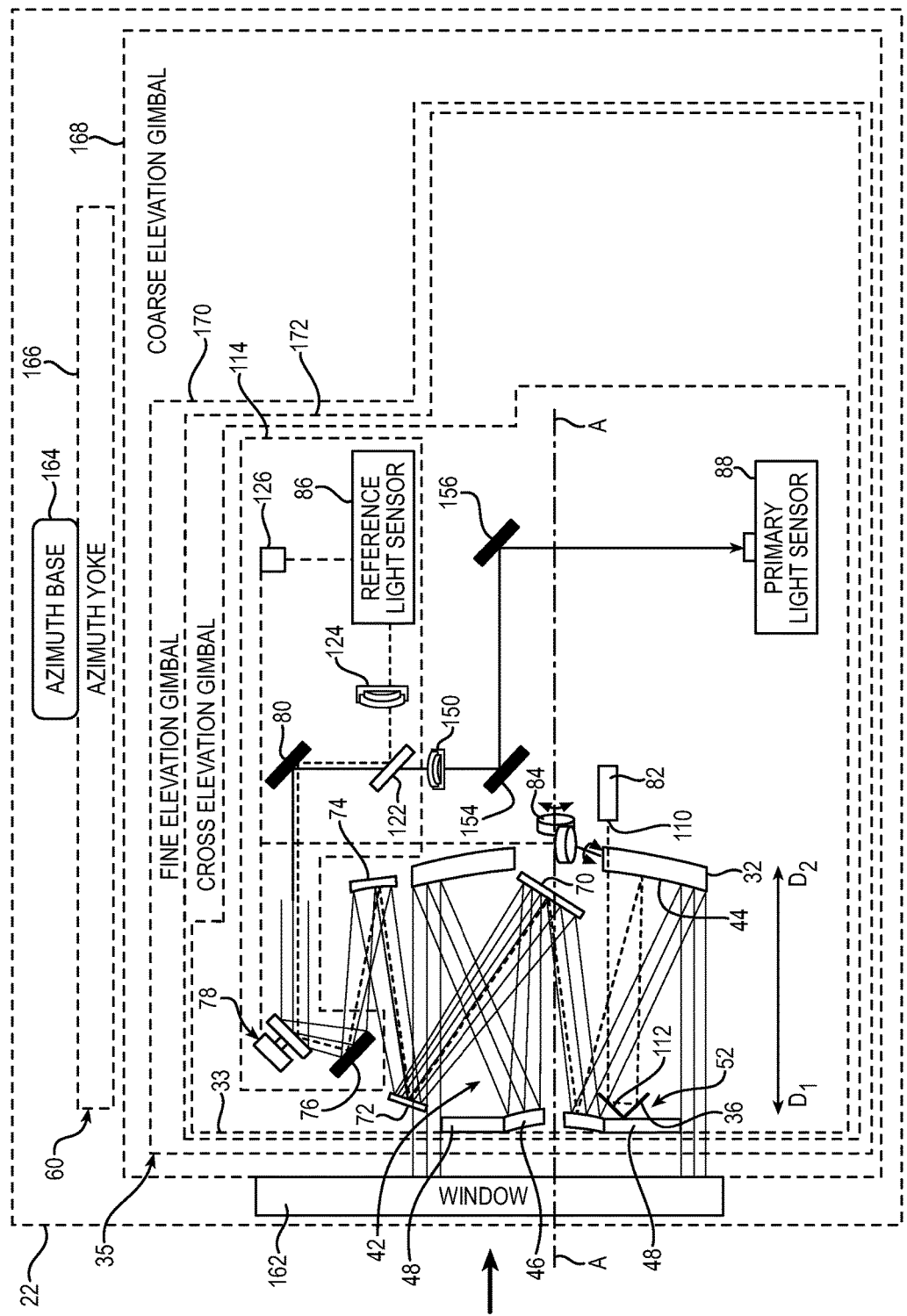
FIG. 3 is a schematic view of the light sensor system of FIG. 1 including an exemplary reference light source and inertial sensor.

FIG. 2 illustrates a front view of the light sensor system 22 that may include a housing (e.g., a coarse pointing structure 30), a primary mirror 32 (e.g., a parabolic primary mirror of a TMA telescope) disposed within the coarse pointing structure 30, multiple light obstructions, and a reference light reflector (e.g., retroreflectors 34-40 that are shown in dashed lines hidden beyond the light obstructions). Referring briefly to FIG. 3, an optical bench 33 (shown schematically) may fixedly attach the primary mirror 32 and the light obstructions to an inner gimbal assembly 35 (shown schematically) that movably attaches the optical bench 33 to the coarse pointing structure 30.

Referring again to FIG. 2, the light obstructions may form an obscured region 42 of the light sensor system 22 between the primary mirror 32 and the target object where the primary light from the target object is not able to pass through to reach a reflective side 44 of the primary mirror 32. The light obstructions may be formed by a secondary mirror 46 (e.g., a hyperbolic secondary mirror of a TMA telescope) and/or multiple support arms 48 that extend radially outwardly from the secondary mirror 46 to attach the secondary mirror 46 to the inner gimbal assembly 35 (shown schematically in FIG. 3) through the optical bench 33. For example, the secondary mirror 46 may form a centrally-obscured region 50 of the obscured region 42 and/or the support arms 48 may form an obscured-spider-support region 52 of the obscured region 42. A portion of the retroreflectors 34-40 may be in the obscured-spider-support region 52 (shown best in FIG. 5).

The optical bench 33, the inner gimbal assembly 35, the coarse pointing structure 30, and/or the support arms 48 may be made of a material with a stiffness of 10,000,000 pounds per square inch (psi), such as aluminum. Aluminum and other materials with a similar stiffness may be easier and less expensive to machine compared to high stiffness materials often utilized in previously known optical sensor systems. In an embodiment, the optical bench, the inner gimbal assembly, the coarse pointing structure, and/or the support arms may be made of a material with a stiffness of 10,000,000 psi or less. In another embodiment, the optical bench, the inner gimbal assembly, the coarse pointing structure, and/or the support arms may be made of a material with a stiffness of 10,000,000 psi or greater.

Turning to FIG. 3, the light sensor system 22 may include a gimbal system 60 and may include a plurality of light reflectors that receive the primary light (e.g., the secondary mirror 46 and/or primary light reflectors 70-80), a reference light source 82, an inertial sensor 84 (e.g., a pair of fiber optic gyroscopes) attached to the primary mirror 32, a reference light sensor 86 (e.g., a duo lateral photodiode or quad detector), and a primary light sensor 88 that receives the primary light.

The reflective side 44 of the primary mirror 32 faces in a first direction $D_1$ to receive the primary light along a central axis A of the primary mirror 32 from the target object. The reference light source 82 may be axially offset from the reflective side 44 along the central axis A in a second direction $D_2$ that is opposite the first direction $D_1$. For example, the reference light source 82 may have an output 110 that is directed toward the retroreflector 36, and that is offset from the reflective side 44 in the second direction $D_2$. Offsetting the reference light source 82 behind the primary mirror 32 may minimize if not eliminate any reduction of primary light that is received by the reflective side 44, compared to another embodiment where reference light source 82 is arranged between the reflective side 44 and the target object.

The output 110 may be arranged in the obscured-spider-support region 52. Arranging the output 110 in the obscured-spider-support region 52 allows the retroreflector 36 to be arranged entirely in the obscured-spider-support region 52, as shown in FIG. 2. In an embodiment, the retroreflector is arranged at least partially in the obscured-spider-support region.

The retroreflector 36 may face in the second direction $D_2$ toward the reflective side 44 of the primary mirror 32. The retroreflector 36 may include a reflective portion 112, which may be arranged in the obscured-spider-support region 52 and oriented to receive the reference light from the output 110 of the reference light source 82. The reflective portion 112 may be oriented to output the reference light toward the reflective side 44 of the primary mirror 32 prior to the reference light reaching any of the secondary mirror 46 and the primary light reflectors 70-78. The reflective portion 112 may be configured to output the reference light parallel and laterally offset to the path of the input of the reference light. In an embodiment, the entire reflective portion is in the obscured region. In another embodiment, only a portion of the reflective portion is in the obscured region.

Arranging the reflective portion 112 in the obscured region 42 allows the retroreflector 36 to minimize if not eliminate the amount of primary light blocked by the retroreflector 36 compared to another embodiment where the reflective portion 112 is arranged partially or entirely outside of the obscured region 42. For example, most of the retroreflector 36 is in the obscured region 42 (shown best in FIG. 5) so that at most only part of the retroreflector 36 blocks primary light from reaching the reflective side 44. In an embodiment, the retroreflector is entirely within the obscured region. In another embodiment, the retroreflector is mostly if not entirely outside of the obscured region.

Still referring to FIG. 3, the light reflectors 70-80 that receive the primary light may be each arranged in a path of the primary light such that each of the light reflectors 70-80 receives and reflects the primary light. Each of the light reflectors 70-80 may be at least partially attached to the optical bench 33 so that each light reflector 70-80 at least partially moves with the optical bench 33.

The secondary mirror 46 may be arranged to receive the primary light directly from the primary mirror 32. For example, the primary light reflected by the reflective side 44 of the primary mirror 32 does not need to reflect off of another reflector before reaching the secondary mirror 46.

The support arms 48 hold the secondary mirror 46 offset from the primary mirror 32 along the central axis A. For example, the support arms 48 are able to hold the secondary mirror 46 coaxially with the central axis A.

The primary light sensor 88 may be arranged to receive the primary light from the light reflectors 70-80. The plurality of light reflectors 70-80 and the primary mirror 32 may be oriented such that the primary light is directed from the primary mirror 32 to the plurality of light reflectors 70-80, and from the plurality of light reflectors 70-80 to the primary light sensor 88. For example, a light control system 114 may receive the primary light and adjust the primary light to compensate for jitter before outputting the primary light to the primary light sensor 88.

The light control system 114 may include an adjustable light component (e.g., the adjustable light reflector 78), a beam splitter 122, the reference light sensor 86, a reference light filter 124 (e.g., a lens with a 405 or 1940 nanometer (nm) notch filter) and control circuitry 126 (e.g., a processor and/or memory with programmed instructions). The beam splitter 122, the reference light sensor 86, and the reference light filter 124 may be fixedly attached to the optical bench 33. In an embodiment, the adjustable light component is an adjustable light refractor, such as a Risley prism assembly.

Still referring to FIG. 3, the control circuitry 126 is connected via information lines (e.g., electrical communication lines, shown as dashed lines) to the primary light reflector 76, the adjustable light reflector 78, the inertial sensor 84, and to the reference light sensor 86. The adjustable light reflector 78 is able to compensate for jitter based on gimbal compensation, acceleration and/or movement detected by the inertial sensor 84, and/or detection of the reference light by the reference light sensor 86 (as shown best in the control system diagram of FIG. 10).

For example, the control circuity 126 may instruct the adjustable light reflector 78 to compensate for jitter based on the detection of the reference light by the reference light sensor 86. The reference light sensor 86 may output a digital signal based on the position or positions of the sensed reference lights, as explained further below with reference to FIG. 8. In an embodiment, the reference light sensor outputs an analog voltage based on the position or positions of the sensed reference lights.

The control circuitry 126 may adjust the optical power of the reference light emitted by the reference light source 82 based on the optical power of the reference light sensed by the reference light sensor 86. Adjusting the optical power allows the control circuity 126 to maintain a constant optical power of the reference light reaching the reference light sensor 86. Maintaining constant optical power allows consistent noise performance. In an embodiment, the control circuitry adjusts the optical power of each reference light together or individually.

The beam splitter 122 may be arranged after the light reflector 80 to separate the reference light and the primary light. The beam splitter may have a relatively high reflective property for the reference light frequency to reflect the reference light toward the reference light sensor 86. The beam splitter 122 may have a relatively low reflective property for the primary light frequency to allow the primary light to pass through to reach the primary light sensor 88. For example, the beam splitter 122 may reflect light in the ultraviolet range and allow light in the visible range to pass through.

The light sensor system 22 may further include focus lenses 150 (e.g., electro-optical focus lenses), a primary light reflector 154, and/or a primary light reflector 156. The light control system 114 may direct the primary light to the primary light sensor 88 via the focus lenses 150, the primary light reflector 154, and/or the primary light reflector 156.

The primary light sensor 88 may be any one of or multiple of a short wavelength infrared sensor, a jitter camera, a color digital television sensor, a wave front error sensor, and/or a monochrome low noise visible to near infrared sensor. In an embodiment, the light sensor system includes a light switch to select between the primary light sensor and another light sensor. For example, the light switch may be the five-position switch disclosed in U.S. patent Ser. No. 15/009,292 entitled OPTICAL SWITCHING DEVICE filed on Jan. 28, 2017, the entirety of which is hereby incorporated by reference.

The gimbal system 60 may allow movement in multiple directions while allowing primary light in through a window 162 that blocks light with a wavelength that is detectable by the reference light sensor 86 (e.g., solar radiation), and allows the primary light to pass through. For example, the reference light sensor 86 may detect wavelengths anywhere from 10 nm to 405 nm and the window 162 may have a coating that blocks 99% of 405 nm or shorter wavelengths.

The gimbal system 60 may include an azimuth base 164 attached to a housing of the vehicle 20 (shown in FIG. 1), an azimuth yoke 166, a coarse elevation gimbal 168, and the inner gimbal assembly 35 (e.g., a fine elevation gimbal 170 and a cross elevation gimbal 172), each of which are configured to coordinate pointing of the primary mirror 32 at the target object to be imaged.

Figure 4:
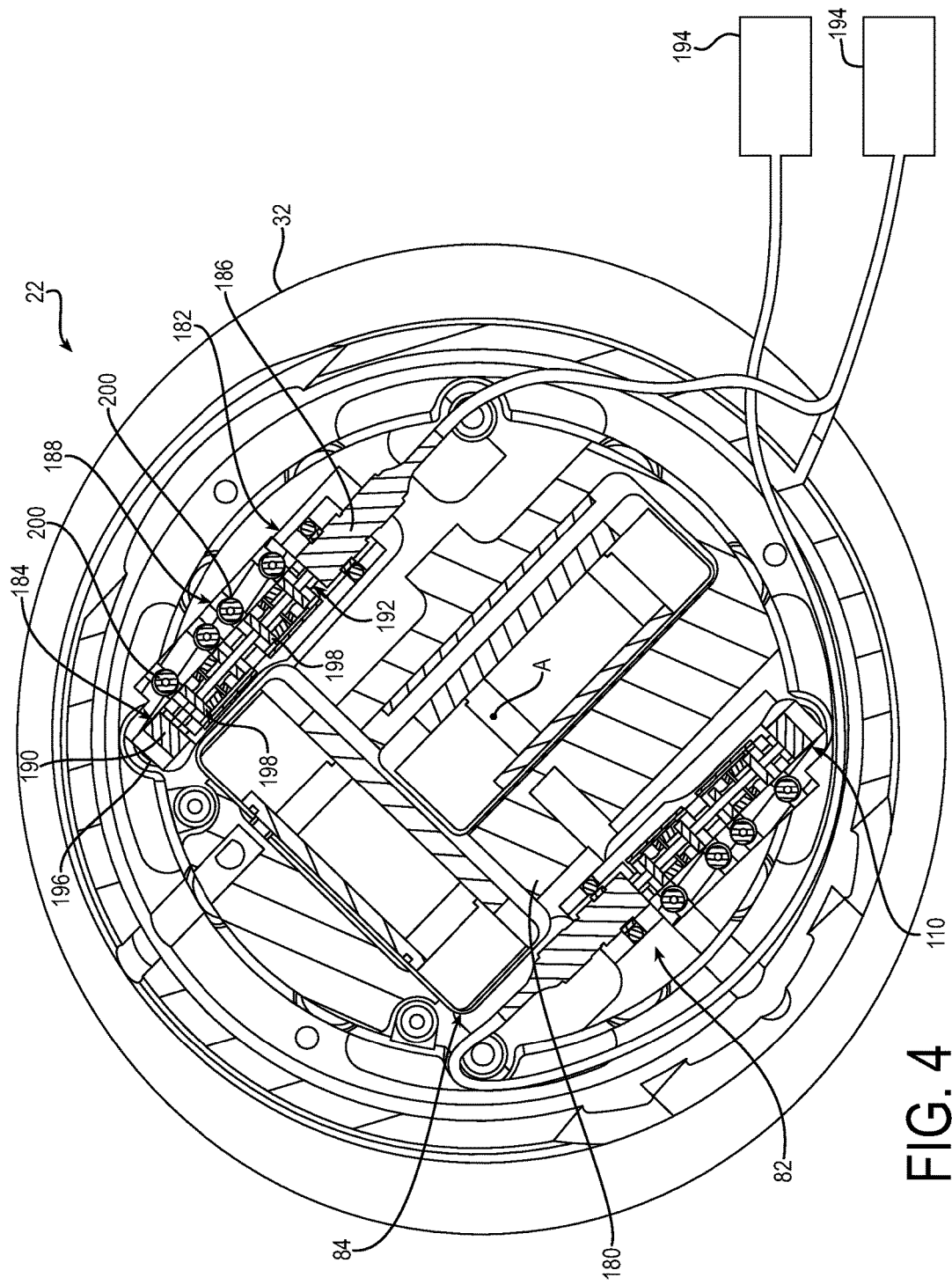
FIG. 4 is a rear cross-sectional view of the light sensor system of FIG. 1 with a rear portion removed, and illustrates two reference light sources along with an inertial sensor.

Referring now to FIG. 4, the reference light source 82 may be attached to the primary mirror 32 such that, when the primary mirror 32 moves, the output 110 moves with the primary mirror 32. For example, the reference light source 82 may be attached to an inertial sensor mount 180 that is fixed to the primary mirror 32. The reference light source 82 may be movable with the inertial sensor mount 180 such that, when the inertial sensor mount 180 moves, the output 110 of the reference light source 82 moves with the inertial sensor mount 180.

Attaching the output 110 to move with the primary mirror 32 allows the reference light to move when the primary mirror 32 and/or the inertial sensor 84 moves.

The inertial sensor 84 may be fixed to the inertial sensor mount 180 such that, when the output 110 of the reference light source 82 moves, the inertial sensor 84 would be moved with the output 110. For example, when the reference light source 82 moves due to vibration of the primary mirror 32 the inertial sensor 84 moves with the output 110.

The light sensor system 22 may include at least a second reference light source 182 with a corresponding output 184. For example, when the outputs 110 and 184 of the reference light sources 82 and 182 move the inertial sensor 84 would be moved with the outputs 110 and 184.

The output 110 of the reference light source 82 may be arranged opposite the output 184 of the reference light source 182 relative to the central axis A. For example, the respective output 110 or 184 of the reference light source 82 and the reference light source 182 may be diametrically opposite one another relative to the central axis A (i.e., spaced circumferentially apart 180° from one another relative to the central axis A).

The reference light sources 82 and 182 may be collimated light sources. The reference light sources 82 and 182 may include a collimator 186, a prism assembly 188, and a fold prism 190 that are mounted to the inertial sensor mount 180. The collimator 186 may be attached to the inertial sensor mount 180 such that, when the primary mirror 32 moves, an output 192 of the collimator 186 moves with the primary mirror 32.

Still referring to FIG. 4, a reference light generator 194 (e.g., a light emitting diode (LED) such as a violet LED) may have an output that is optically connected to the corresponding collimator 186. For example, a fiber optic cable directs light generated by one of the reference light generators 194 to the corresponding collimator 186. The collimator 186 is able to collimate the light generated by the corresponding reference light generator 194 into parallel or substantially parallel rays to form the reference light that is output by the output of the fold prism 190. For example, the output of the fold prism 190 may be aligned with a through hole 196 (shown best in FIG. 5) formed in the inertial sensor mount 180. The fold prism 190 may be aligned with the corresponding retroreflector 34 (shown best in FIG. 7).

The prism assembly 188 may be attached to the inertial sensor mount 180 such that, when the primary mirror 32 moves, the prism assembly 188 moves with the primary mirror 32. The prism assembly 188 may include a pair of Risley prism pairs 198 and spur gears 200 that are coupled to each prism of the Risley prism pairs 198 to adjust each prism 198. The spur gears 200 may be configured to adjust the alignment of the prisms 198.

In an embodiment, the two reference light sources include a single laser diode and a 1:2 fiber splitter. In another embodiment, more than two reference light sources are utilized. Each reference light source may be collimated. For example, each reference light source may be identical to one another. Each corresponding output may be equally spaced from the central axis and/or arranged equally spaced circumferentially apart from one another.

The inertial sensor mount 180 may be fixed to the primary mirror 32 such that the inertial sensor mount 180 moves with the primary mirror 32. The inertial sensor mount 180 may be made of a material with a stiffness of 10,000,000 psi, such as aluminum, to keep the inertial sensor mount 180 fixed to the primary mirror 32. In an embodiment, inertial sensor mount may be made of a material with a stiffness of 10,000,000 psi or less. In another embodiment, inertial sensor mount may be made of a material with a stiffness of 10,000,000 psi or greater.

Figure 5:
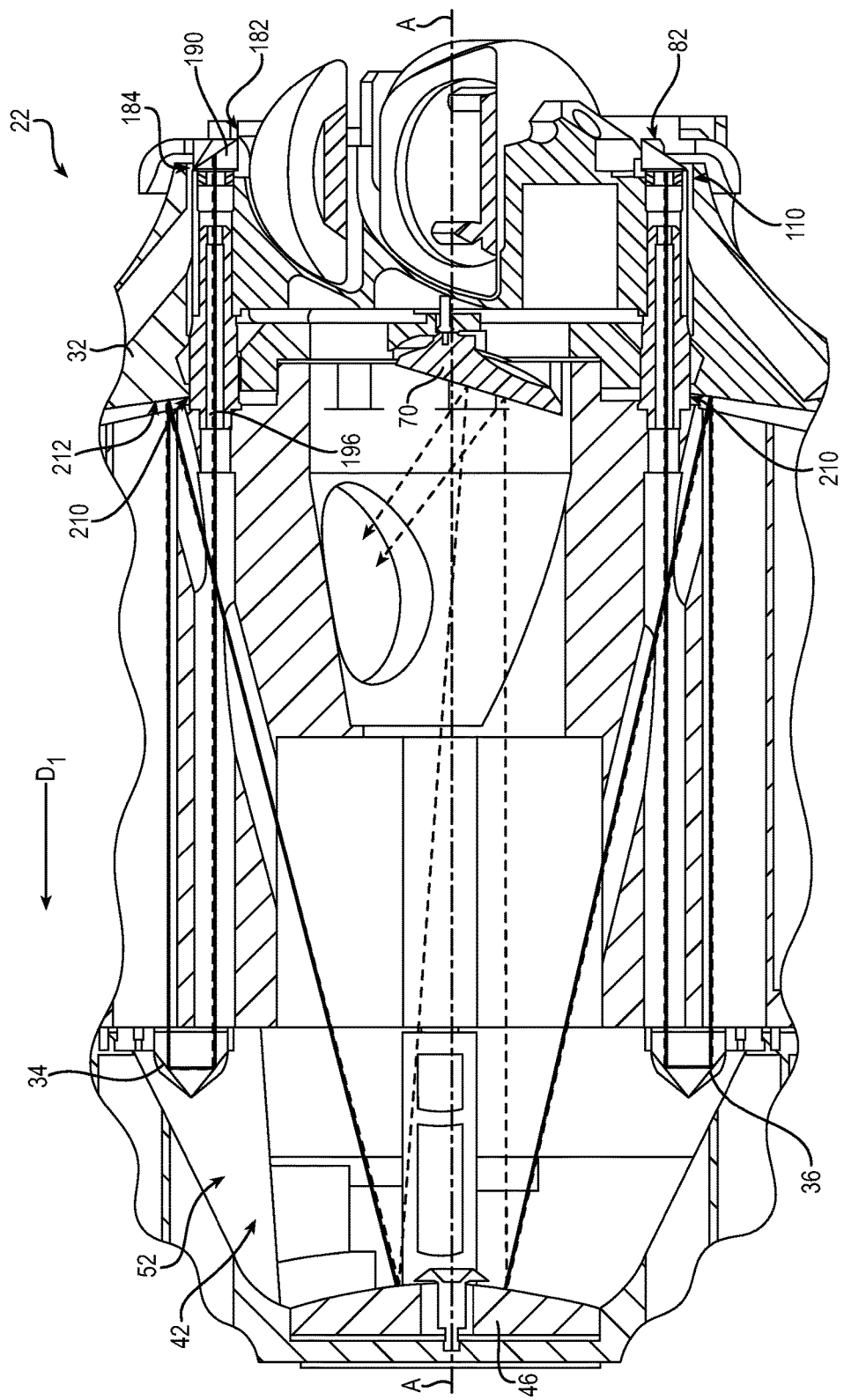
FIG. 5 is a cross-sectional view of the light sensor system including retroreflectors and the corresponding reference light sources of FIG. 4.

FIG. 5 illustrates a cross-section of the light sensor system 22. Each reference light source 82 and 182 may be arranged in the obscured region 42. For example, the output 184 of the reference light source 182 may be directed toward a portion of the obscured region 42 such that, when the output 184 provides the reference light, the reference light would pass through the portion of the obscured region 42. The output 110 and 184 of each reference light source 82 and 182 may be directed along the first direction $D_1$ toward the corresponding retroreflector 34 or 36.

The output of the fold prism 190 may form the output 184 of the reference light source 182. In an embodiment, the output of the reference light source may be formed by another component of the reference light source, such as a Risley prism or an output of the collimator. For example, at least one Risley prism pair may be attached to the inertial sensor mount and configured to form the output of the reference light source that outputs the reference light to the corresponding retroreflector. It should be appreciated that the output 110 of the reference light source 82 may be similarly formed.

Referring still to FIG. 5 and later to FIG. 6, the reference light from each reference light source 82 and 182 may be directed to the light reflectors 46 and 70 along the path of the primary light (shown best in FIG. 3). For example, each reference light travels through an opening 210 of the primary mirror 32 and the hole 196 prior to reaching the corresponding retroreflector 34 or 36, or any of the primary light reflectors 46 or 70-80 (shown in FIG. 3). The reference lights travel from the corresponding reference light source 110 or 182 through the obscured region 42 to the correspondence retroreflector 34 or 36. Each retroreflector 34 or 36 redirects the corresponding reference light along the path of the primary light.

Figure 6:
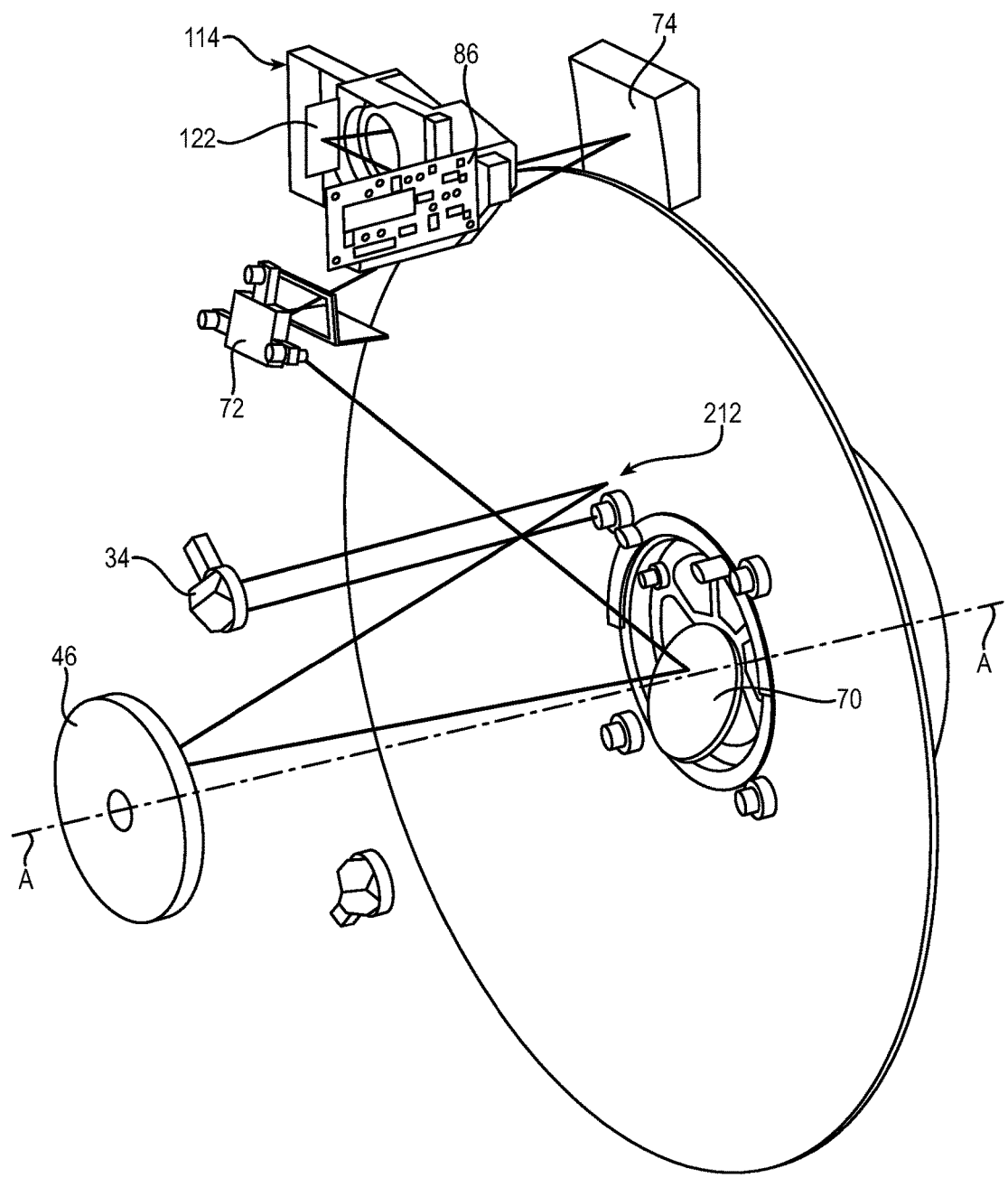
FIG. 6 is an oblique view of the light sensor system of FIG. 1 with multiple components and a housing removed, and illustrates a primary mirror and a path of a reference light.

Referring now to FIG. 6, for example, the retroreflector 34 redirects the corresponding reference light toward the primary mirror 32 parallel to the incoming primary light (e.g., parallel to the central axis A). The reference light may be laterally offset from the incoming primary light.

The reference light may impinge the primary mirror 32 and the primary mirror 32 may reflect the reference light toward the secondary mirror 46. For example, the reference light impinges an obscured portion 212 (shown best in FIG. 5) of the primary mirror 32 and is reflected to the secondary mirror 46.

The reference light may continue to follow the path of the primary light. For example, the reference light may reflect off the secondary mirror 46 to the primary light reflector 70, from the primary light reflector 70 to the primary light reflector 72, from the primary light reflector 72 to the primary light reflector 74, from the primary light reflector 74 to the primary light reflector 76, and from the primary light reflector 76 and the remaining primary light reflectors 78 and 80 (shown in FIG. 3) to the reference light sensor 86 of the light control system 114.

Referring again to FIG. 3, as discussed above, the reference light may be directed to from the light reflectors 70-80 to the reference light sensor 86. The reference light may reflect off the primary light reflector 76 toward the primary light reflector 78, from the primary light reflector 78 to the primary light reflector 80, from the primary light reflector 80 to the beam splitter 122, and from the beam splitter 122 to the reference light sensor 86 through the reference light filter 124.

The reference light sensor 86 may detect the reference lights after the reference lights reflect off each light reflector 70-80. The reference light sensor 86 may be able to detect displacement of the reference lights that is due to structural dynamics of the primary mirror 32 and any of the light reflectors 46 and/or 70-80.

For example, the reference sensor 86 may detect the position, movement, and/or angle of the reference light (e.g., azimuth and elevation motion of the primary light sensor 88). The position, movement, and/or angle of the reference light may be based the structural movement information of the primary mirror 32 and/or the light reflectors 70-80. Accordingly, the primary light reflector 78 can compensate for jitter based on the detected reference light.

The adjustable light reflector 78 may be adjusted in accordance with the control system described below. For example, the adjustable light reflector 78 and/or another adjustable light reflector (e.g., primary light reflector 80) are adjusted based on the reference light to compensate for jitter of the light sensor system 22. The adjustable light reflector 78 may be adjustable based on the structural movement information of each reference light relative to the other. In an embodiment, one or more of the adjustable light reflectors is adjustable based on the structural movement information of a reference light independent of any other reference light.

The reference light source 82 may provide the reference light at a frequency that is offset from the electromagnetic frequency range of the corresponding primary light sensor 88. For example, the primary light sensor 88 may be able to detect light within the infrared range and the reference light source 82 may provide the reference light within the ultraviolet light range such that the primary light sensor is unable to detect the reference light.

Figure 7:
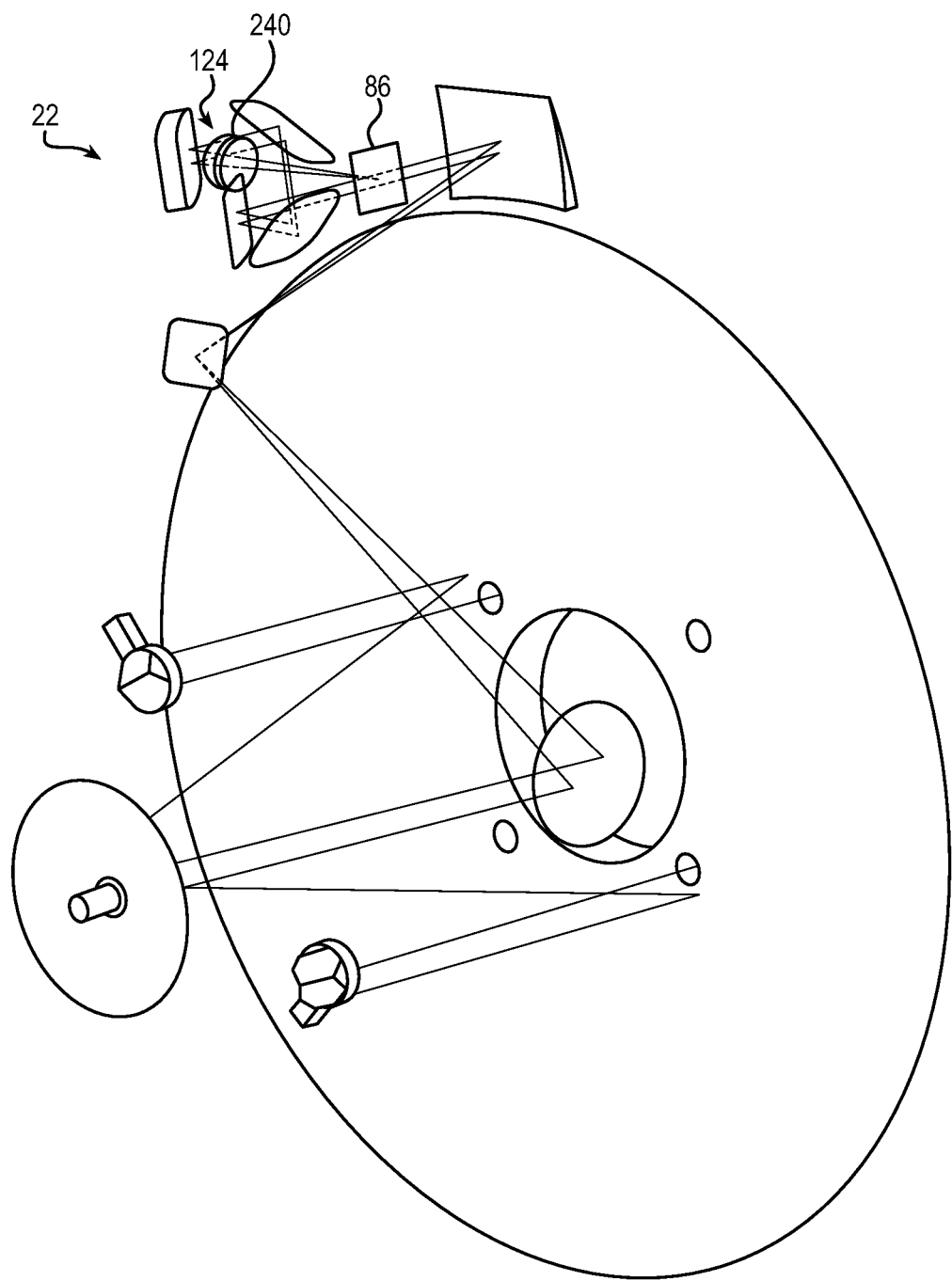
FIG. 7 is an oblique view of the light sensor system of FIG. 1 with multiple components removed, and illustrates the path of two reference lights through a reference light filter including a light mask.
Figure 8:
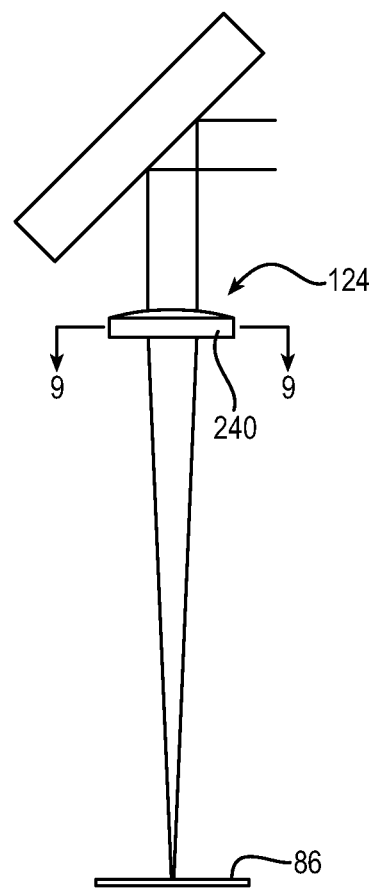
FIG. 8 is a side view of a portion of the light sensor system of FIG. 7 including the light mask.

Referring now to FIGS. 7 and 8, the reference light filter 124 of the light sensor system 22 may include a light mask 240 before the reference light sensor 86 to any light that is not near the position of the reference light (e.g., to block solar radiation) from reaching the reference light sensor 86. As shown in FIG. 8, when there is no jitter, each reference light may be directed to the same position on the reference light sensor 86. When jitter is present, both reference lights may both be directed to a second position on the reference light sensor 86. If the primary mirror 32 (shown in FIG. 3) is elastically deformed due to the jitter, the primary mirror 32 may cause the reference lights to be directed to different positions on the reference light sensor 86.

In an embodiment, the position of each sensed reference light is output separately. The reference lights may be turned on and off in an alternating fashion (i.e., time modulated) so that the output digital signal is specific to the reference light that is on when the digital signal is output. Detecting the position of each reference light individually allows the reference light sensor to detect the elastic deformation of the primary mirror based on relative movement of each reference light output by the corresponding reference light source. For example, more than two reference lights may be time modulated so that only one reference light is on at any given time to allow the reference light sensor to detect the deformation of the primary mirror.

The light mask 240 may include a fused silica lens. The light mask 240 is able to reduce solar radiation before the reference light reaches the reference light sensor 86.

Figure 9:
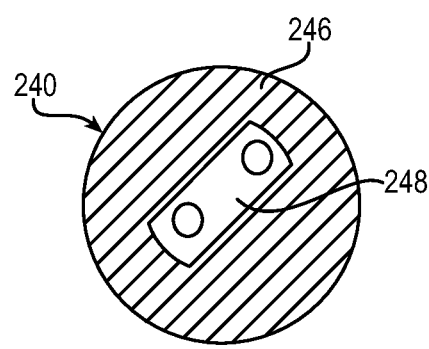
FIG. 9 is a top view of the mask of FIG. 8 including a reference light through path.

Referring now to FIG. 9, the light mask 240 may include a masking portion 246 that blocks solar radiation and a reference light through path 248 that allows the reference lights to pass through to reach the reference light sensor 86 (shown in FIG. 8). The reference light through path 248 may be aligned with the reference lights to allow the reference lights to pass through the light mask 240 to the reference light sensor 86 (shown in FIG. 8). For example, the nominal position of each reference light is illustrated as a corresponding circle within the reference light through path 248.

Figure 10:
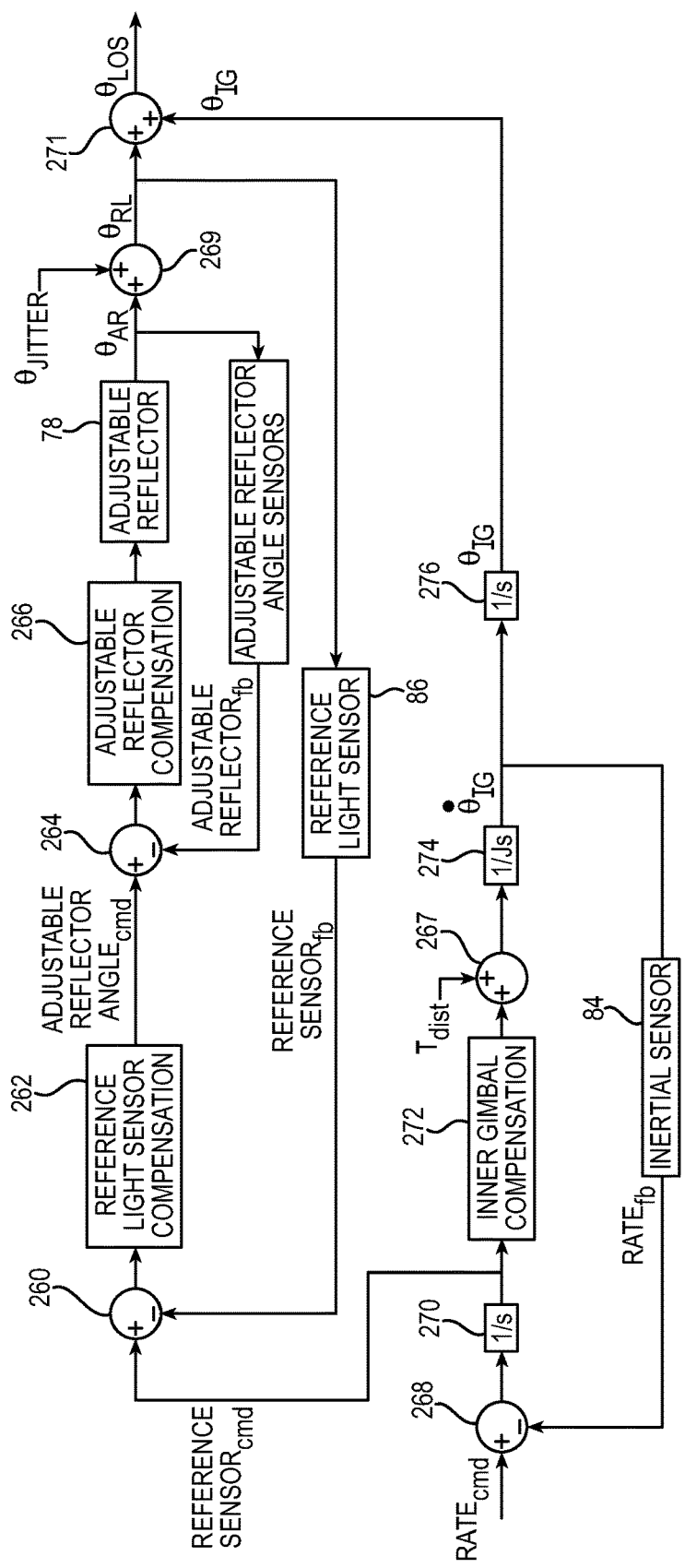
FIG. 10 is a control system diagram of the light sensor system of FIG. 1.

FIG. 10 illustrates a control system diagram of the light sensor system 22 (shown in FIG. 3). The control circuitry 126 (shown in FIG. 3) and/or other circuitry (e.g., a processor and/or memory with programmed instructions) may be configured to perform any portion of or all of the summation, subtraction, or integration functions of the control system diagram. For example, the control circuitry 126 may receive sensor data from each sensor described above and perform the summation, subtraction, and integration functions of the control system diagram.

As illustrated in FIG. 10, a subtractor 260 may receive a reference light sensor command (Reference Sensor$_{cmd}$) (e.g., integrated rate error motion) and a reference light sensor feedback (Reference Sensor$_{fb}$) that is based on the position detected by the reference light sensor 86 (e.g., based on a motion of the reference light). The subtractor 260 may subtract the reference light sensor feedback from the reference light sensor command and the result may be input into a reference light sensor compensator 262 to account for jitter detected by the reference light sensor 86.

A subtractor 264 may receive an image motion compensator angle command (e.g., an Adjustable Reflector Angle$_{cmd}$) that is output from the reference light sensor compensator 262, and may receive an angle feedback of the adjustable reflector 78 (e.g., an Adjustable Reflector$_{fb}$) based on an amount of motion of the adjustable light reflector 78 (shown in FIG. 3). The subtractor 264 may subtract the Adjustable Reflector$_{fb}$ from the Adjustable Reflector Angle$_{cmd}$. The result may be input into an image motion compensator (e.g., an adjustable reflector compensator 266), the output of which may be provided to the adjustable light reflector 78.

The adjustable light reflector 78 may cause an image motion compensator output motion (e.g., an angle change of the reference light caused by the adjustable reflector $\theta_{AR}$). The angle change of the reference light caused by the adjustable reflector $\theta_{AR}$ may be summed by an adder 269 with a jitter motion $\theta_{JITTER}$ that is based on disturbance introduced to the light sensor system 22 (shown in FIG. 3) (e.g., disturbance based on the structural dynamics of the light sensor system 22 and vibration of the aircraft 20 (shown in FIG. 1)). The resulting output is the motion of the reference light (e.g., an angle of the reference light $\theta_{RL}$ relative to the position of the inner gimbal assembly 35 (shown in FIG. 3)).

The angle of the reference light $\theta_{RL}$ may be summed by an adder 271 with an optical bench motion (e.g., a position $\theta_{IG}$ of the inner gimbal assembly 35 with respect to a forward direction of the aircraft 20). A system operator may adjust the position $\theta_{IG}$ of the inner gimbal assembly 35 to adjust the orientation of the optical bench 33 so that primary mirror 32 (shown in FIG. 3) is directed at the target object. The resulting output may be a line of sight motion $\theta_{LOS}$ (e.g., residual error remaining after corrections have been made based on the Reference Sensor$_{fb}$ and a rate feedback (Rate$_{fb}$)).

The control system may further include a subtractor 268 that subtracts the Rate$_{fb}$ that is based on the output of the inertial sensor 84 from a rate command (Rate$_{cmd}$) that is based on a target position of the line of sight (e.g., the target object) of the light sensor system 22. The resulting output may be integrated by an integrator 270 and the resulting integration may be the Reference Sensor$_{cmd}$ that may be input into an inner gimbal compensator 272. The output of the inner gimbal compensator 272 may be summed by an adder 267 with a disturbance torque T$_{Dist}$. The disturbance torque T$_{Dist}$ may be the resulting total force or torque exerted on the imaging components of the light sensor system 22 (shown in FIG. 3), including the total external forces acting on the imaging components through the inner gimbal assembly 35 (shown in FIG. 3). For example, forces mainly due to vibration of the aircraft 20 (shown in FIG. 1).

The disturbance torque T$_{Dist}$ may present errors in the position $\theta_{IG}$ of the inner gimbal assembly 35 that direct the optical bench 33 away from the target object. These position errors may be fed forward in the Reference Sensor$_{cmd}$ so that the adjustable reflector 78 adjusts to compensate for the position errors and jitter, as discussed above.

The output of the adder 267 may be provided to an inertial load integrator 274. The output of the inertial load integrator 274 may be an optical bench rate of motion (e.g., an inner gimbal rate of motion $\dot{\theta}_{IG}$), which may be integrated by an integrator 276 to provide the position of the inner gimbal assembly $\theta_{IG}$ that is added to the position of the reference light $\theta_{RL}$.

Figure 11:
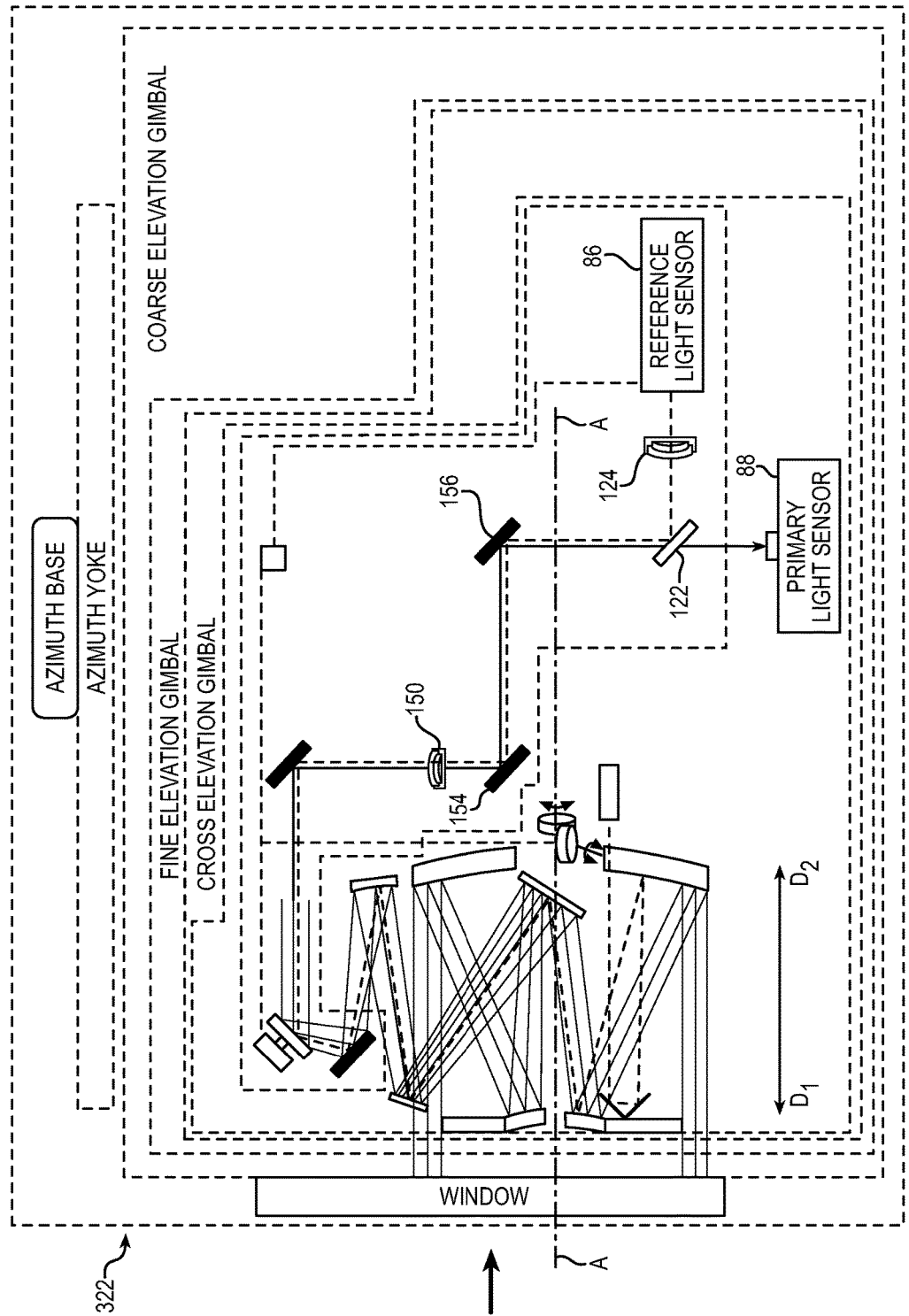
FIG. 11 is a schematic view of another exemplary light sensor system including an exemplary reference light source and an exemplary inertial sensor.

Turning now to FIG. 11, an exemplary embodiment of the light sensor system is shown at 322. The light sensor system 322 is substantially the same as the above-referenced light sensor system 22, and consequently the same reference numerals are used to denote structures corresponding to similar structures in the light sensor systems. In addition, the foregoing descriptions of the light sensor system 22 is equally applicable to the light sensor system 322 except as noted below. Moreover, it will be appreciated upon reading and understanding the specification that aspects of the light sensor systems may be substituted for one another or used in conjunction with one another where applicable.

The light sensor system 322 allows the reference light to move with the primary light past the primary light reflectors 154 and 156. In this embodiment, the beam splitter 122 does not reflect the reference light before the reference light reaches the primary light reflector 154. The beam splitter 122 may be positioned to receive the primary light and the reference light from the primary light reflector 156 so that the beam splitter 122 may split the reference light and the primary light. For example, beam splitter 122 reflects the reference light to the reference light sensor 86, and the primary light passes through the beam splitter 122 to reach the primary light sensor 88.

The reference light sensor 86 may detect the structural dynamics of a focus lens 150 and the primary light reflectors 154 and 156 in addition to the structural dynamics of preceding optical components, as discussed above with reference to FIG. 3. For example, the reference light filter 124 and the reference light sensor 86 may be positioned to receive the reference light after the reference light moves past the primary light reflectors 154 and 156.

Figure 12:
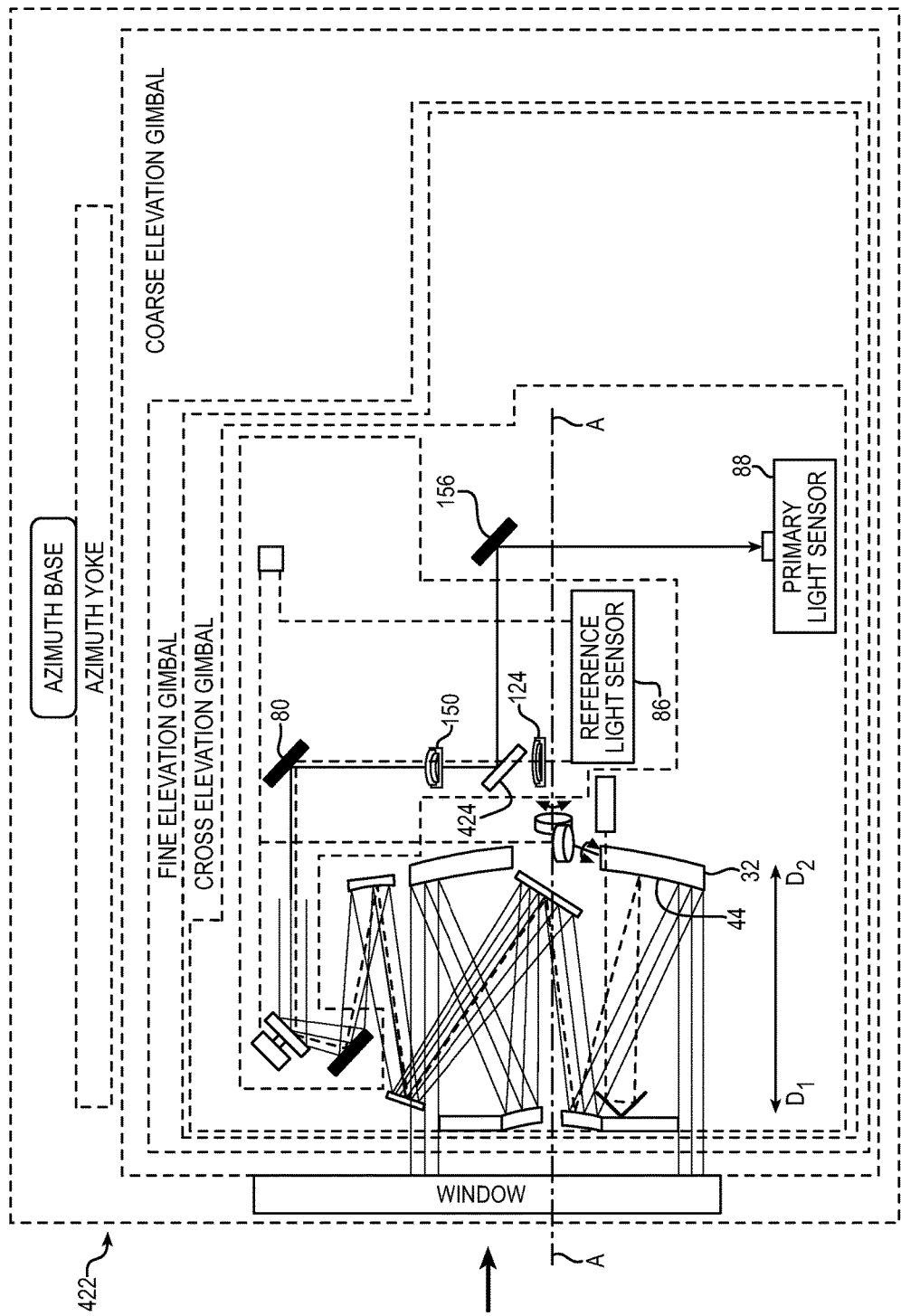
FIG. 12 is a schematic view of yet another exemplary light sensor system including an exemplary reference light source and an exemplary inertial sensor.

Turning now to FIG. 12, an exemplary embodiment of the light sensor system is shown at 422. The light sensor system 422 is substantially the same as the above-referenced light sensor systems 22 and 322, and consequently the same reference numerals are used to denote structures corresponding to similar structures in the light sensor systems. In addition, the foregoing descriptions of the light sensor systems 22 and 322 are equally applicable to the light sensor system 422 except as noted below. Moreover, it will be appreciated upon reading and understanding the specification that aspects of the light sensor systems may be substituted for one another or used in conjunction with one another where applicable.

The light sensor system 422 allows the reference light to move with the primary light past the first focus lens 150. The light sensor system 422 includes a beam splitter 424 before the primary light reflector 156.

In this embodiment, the beam splitter 424 does not reflect the reference light before the first focus lens 150 after the reference light is reflected by the primary light reflector 80. The beam splitter 424 may be positioned to receive the primary light and the reference light from the primary light reflector 80 so that the beam splitter 424 may split the reference light and the primary light. For example, the reference light passes through the beam splitter 424 to reach the reference light sensor 86, and the beam splitter 424 reflects the primary light to the primary light sensor 88 via the primary light reflector 156.

The reference light sensor 86 may detect the structural dynamics of the first focus lens 150. For example, the reference light filter 124 and the reference light sensor 86 may be positioned to receive the reference light after the reference light moves past the first focus lens 150 and the beam splitter 424.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A light sensor system including:
   a housing;
   a primary mirror with a reflective side facing in a first direction to receive a primary light along a central axis of the primary mirror from a target object, wherein the primary mirror is disposed within the housing;
   a plurality of light reflectors, at least one of the plurality of light reflectors receiving the primary light directly from the primary mirror, wherein each of the plurality of light reflectors is arranged in a path of the primary light such that each of the plurality of light reflectors receives and reflects the primary light;
   an inertial sensor mount that is fixed to the primary mirror; and
   a reference light source having an output directed along the first direction, the reference light source attached to the inertial sensor mount and movable with the inertial sensor mount such that, when the inertial sensor mount moves, the output of the reference light source moves with the inertial sensor mount;
   wherein the output of the reference light source is fixed relative to a portion, of the inertial sensor mount, that is fixed relative to the primary mirror, whereby the output of the reference light source is fixed relative to the primary mirror.

2. The light sensor system of claim 1, wherein the reference light source is arranged in an obscured region of the light sensor system.

3. The light sensor system of claim 1, further including a retroreflector facing toward the reflective side of the primary mirror in a second direction that is opposite the first direction, wherein a reflective portion of the retroreflector is in an obscured region of the light sensor system and is oriented to receive a reference light from the reference light source such that the received reference light would be output in the first direction toward the reflective side of the primary mirror prior to reaching the plurality of light reflectors.

4. The light sensor system of claim 1, further including one or more light obstructions between the primary mirror and the target object, wherein the one or more light obstructions form an obscured region where the primary light from the target object would not pass through to reach the reflective side of the primary mirror;
   wherein the output of the reference light source is directed toward a portion of the obscured region such that when the output provides a reference light the reference light would pass through the portion of the obscured region.

5. The light sensor system of claim 1, wherein the reference light source is axially offset from the reflective side of the primary mirror along the central axis in a second direction that is opposite the first direction such that, when the reference light source provides a reference light, the reference light travels through an opening of the primary mirror prior to reaching the plurality of light reflectors.

6. The light sensor system of claim 1, wherein the reference light source provides a reference light at a frequency that is offset from an electromagnetic frequency range of the primary light sensor.

7. The light sensor system of claim 1, further including:
   a reference light sensor that would detect a reference light output by the reference light source after the reference light would reflect off each of the plurality of light reflectors, wherein the reference light sensor is able to detect displacement of the reference light that is due to structural dynamics of the primary mirror and the plurality of light reflectors; and
   a control circuitry configured to adjust an optical power of the output of the reference light source based on the optical power of the reference light detected by the reference light sensor.

8. The light sensor system of claim 1, further including:
   one or more reference light sensors that detect a reference light of the reference light source and a second reference light after the reference light and the second reference light reflect off each of the plurality of light reflectors, wherein the reference light sensor is configured to detect elastic deformation of the primary mirror based on the divergence of the reference light from the second reference light.

9. The light sensor system of claim 1, wherein the reference light source is a first reference light source that outputs a first reference light; and
   wherein the light sensor system further includes a second reference light source that is attached to the inertial sensor mount such that, when the inertial sensor mount moves, an output of the second reference light source would move with the inertial sensor mount, wherein the output of the second reference light source is directed along the first direction and outputs a second reference light.

10. A vehicle including:
    a light sensor system including:
       a housing;
       a primary mirror with a reflective side facing in a first direction to receive a primary light along a central axis of the primary mirror from a target object, wherein the primary mirror is disposed within the housing;
       a plurality of light reflectors, at least one of the plurality of light reflectors receiving the primary light directly from the primary mirror, wherein each of the plurality of light reflectors is arranged in a path of the primary light such that each of the plurality of light reflectors receives and reflects the primary light;
       an inertial sensor mount that is fixed to the primary mirror;
       a first reference light source having an output directed along the first direction, the first reference light source attached to the inertial sensor mount and movable with the inertial sensor mount such that, when the inertial sensor mount moves, the output of the first reference light source moves with the inertial sensor mount and outputs a first reference light;
       a second reference light source that is attached to the inertial sensor mount such that, when the inertial sensor mount moves, an output of the second reference light source would move with the inertial sensor mount, wherein the output of the second reference light source is directed along the first direction and outputs a second reference light;
an inertial sensor that is fixed to the inertial sensor mount such that when the outputs of the reference light sources move the inertial sensor would be moved with the outputs;
a reference light sensor that would detect the reference lights after the reference lights would reflect off each of the plurality of light reflectors, wherein the reference light sensor is able to detect displacement of the reference lights that is due to structural dynamics of the primary mirror and the plurality of light reflectors;
a primary light sensor that is arranged to receive the primary light from the plurality of light reflectors, wherein the plurality of light reflectors and the primary mirror are oriented such that the primary light is directed from the primary mirror to the plurality of light reflectors, and from the plurality of light reflectors to the primary light sensor;
wherein the plurality of light reflectors includes an adjustable light component that is movable based on the detected displacement of the reference lights to compensate for jitter of the light sensor system;
wherein the output of the first reference light source is arranged opposite the output of the second reference light source relative to the central axis;
wherein the first reference light source is a first collimated light source and the second reference light source is a second collimated light source.

11. A method of operating a light sensor system including:
a housing;
a primary mirror with a reflective side facing in a first direction to receive a primary light along a central axis of the primary mirror from a target object, wherein the primary mirror is disposed within the housing;
a plurality of light reflectors, at least one of the plurality of light reflectors receiving the primary light directly from the primary mirror, wherein each of the plurality of light reflectors is arranged in a path of the primary light such that each of the plurality of light reflectors receives and reflects the primary light;
an inertial sensor mount that is fixed to the primary mirror; and
a reference light source having an output directed along the first direction, the reference light source attached to the inertial sensor mount and movable with the inertial sensor mount such that, when the inertial sensor mount moves, the output of the reference light source moves with the inertial sensor mount;
wherein the output of the reference light source is fixed relative to a portion, of the inertial sensor mount, that is fixed relative to the primary mirror, whereby the output of the reference light source is fixed relative to the primary mirror; and
wherein the method further includes:
directing a reference light output by the reference light source to the plurality of light reflectors along the path of the primary light; and
directing the reference light from the plurality of light reflectors to a reference light sensor, thereby providing structural movement information of the primary mirror and/or the plurality of light reflectors to the reference light sensor, wherein the plurality of light reflectors includes at least one adjustable light component that receives the primary light; and
adjusting the at least one adjustable light component based on the structural movement information to compensate for jitter of the light sensor system.

12. A light sensor system including:
a housing;
a primary mirror with a reflective side facing in a first direction to receive a primary light along a central axis of the primary mirror from a target object, wherein the primary mirror is disposed within the housing;
a plurality of light reflectors, at least one of the plurality of light reflectors receives the primary light directly from the primary mirror, and wherein each of the plurality of light reflectors is arranged in a path of the primary light such that each of the plurality of light reflectors receives and reflects the primary light;
one or more light obstructions between the primary mirror and the target object, wherein the one or more light obstructions form an obscured region where the primary light from the target object would not pass through to reach the reflective side of the primary mirror; and
a reference light source that is movable with the primary mirror, wherein an output of the reference light source is directed toward a portion, of the obscured region, that is radially inward of a radially outermost portion of the reflective side of the primary mirror, such that when the output provides a reference light the reference light would be radially inward of the radially outermost portion and pass through the portion of the obscured region.

13. The light sensor system of claim 12, wherein the plurality of light reflectors includes a secondary mirror that is arranged to receive the primary light directly from the primary mirror, wherein the secondary mirror forms at least one of the one or more light obstructions between the primary mirror and the target object; and
wherein the light sensor system further includes one or more support arms that attach the secondary mirror to the housing and hold the secondary mirror offset from the primary mirror along the central axis, wherein the one or more support arms extend radially outwardly from the secondary mirror such that the one or more support arms form at least a second of the one or more light obstructions between the primary mirror and the target object.

14. The light sensor system of claim 13, wherein the one or more support arms form an obscured spider support region of the obscured region, and wherein the output of the reference light source is arranged in the obscured spider support region.

15. The light sensor system of claim 12, further including a retroreflector facing toward the reflective side of the primary mirror in a second direction opposite the first direction, wherein a reflective portion of the retroreflector is in the obscured region and the reflective portion is oriented to receive the reference light from the reference light source such that the received reference light would be output in the first direction toward the reflective side of the primary mirror prior to reaching the plurality of light reflectors.

16. The light sensor system of claim 12, further including an inertial sensor mount that is movable with the primary mirror;
wherein the reference light source that is attached to the inertial sensor mount and movable with the inertial sensor mount such that when the inertial sensor mount moves the output of the reference light source moves with the inertial sensor mount.

17. The light sensor system of claim 12, wherein the reference light source is axially offset from the reflective side along the central axis in a second direction that is opposite the first direction such that when the reference light source provides the reference light the reference light would travel through an opening of the primary mirror prior to reaching the plurality of light reflectors.

18. The light sensor system of claim 12, wherein the reference light source provides the reference light at a frequency that is offset from the electromagnetic frequency range of the primary light sensor.

19. A vehicle including:
a light sensor system including:
a housing;
a primary mirror with a reflective side facing in a first direction to receive a primary light along a central axis of the primary mirror from a target object, wherein the primary mirror is disposed within the housing;
a plurality of light reflectors, at least one of the plurality of light reflectors receives the primary light directly from the primary mirror, and wherein each of the plurality of light reflectors is arranged in a path of the primary light such that each of the plurality of light reflectors receives and reflects the primary light;
one or more light obstructions between the primary mirror and the target object, wherein the one or more light obstructions form an obscured region where the primary light from the target object would not pass through to reach the reflective side of the primary mirror; and
a first reference light source that is movable with the primary mirror, wherein an output of the first reference light source is directed toward a portion of the obscured region such that when the output provides a first reference light the first reference light would pass through the portion of the obscured region;
a second reference light source that is attached to the primary mirror such that when the primary mirror moves the output of the first reference light source and an output of the second reference light source would move with the primary mirror, wherein the output of the second reference light source is directed along the first direction and outputs a second reference light;
an inertial sensor mount that is fixed to the primary mirror;
an inertial sensor that is fixed to the inertial sensor mount such that when the outputs of the reference light sources move the inertial sensor would be moved with the outputs;
a reference light sensor that would detect the reference lights after the reference lights would reflect off each of the plurality of light reflectors, wherein the reference light sensor is able to detect displacement of the reference lights that is due to structural dynamics of the primary mirror and the plurality of light reflectors;
a primary light sensor that is arranged to receive the primary light from the plurality of light reflectors, wherein the plurality of light reflectors and the primary mirror are oriented such that the primary light is directed from the primary mirror to the plurality of light reflectors, and from the plurality of light reflectors to the primary light sensor;
wherein the plurality of light reflectors includes an adjustable light component that is movable based on the detected displacement of the reference lights to compensate for jitter of the light sensor system;
wherein the output of the first reference light source is arranged opposite the output of the second reference light source relative to the central axis;
wherein the first reference light source is a first collimated light source and the second reference light source is a second collimated light source.

20. A method of operating a light sensor system including:
a housing;
a primary mirror with a reflective side facing in a first direction to receive a primary light along a central axis of the primary mirror from a target object, wherein the primary mirror is disposed within the housing;
a plurality of light reflectors, at least one of the plurality of light reflectors receives the primary light directly from the primary mirror, and wherein each of the plurality of light reflectors is arranged in a path of the primary light such that each of the plurality of light reflectors receives and reflects the primary light;
one or more light obstructions between the primary mirror and the target object, wherein the one or more light obstructions form an obscured region where the primary light from the target object would not pass through to reach the reflective side of the primary mirror; and
a reference light source that is movable with the primary mirror, wherein an output of the reference light source is directed toward a portion, of the obscured region, that is radially inward of a radially outermost portion of the reflective side of the primary mirror, such that when the output provides a reference light the reference light would be radially inward of the radially outermost portion and pass through the portion of the obscured region;
wherein the method further includes:
directing the reference light to the plurality of light reflectors along the path of the primary light; and
directing the reference light from the plurality of light reflectors to a reference light sensor, thereby providing structural movement information of the primary mirror and/or the plurality of light reflectors to the reference light sensor, wherein the plurality of light reflectors includes at least one adjustable light component that receives the primary light; and
adjusting the at least one adjustable light component based on the structural movement information to compensate for jitter of the light sensor system.

* * * * *